(12) United States Patent
Glenn et al.

(10) Patent No.: US 6,528,875 B1
(45) Date of Patent: Mar. 4, 2003

(54) VACUUM SEALED PACKAGE FOR SEMICONDUCTOR CHIP

(75) Inventors: Thomas P. Glenn, Gilbert, AZ (US); Roy D. Hollaway, Chandler, AZ (US); Steven Webster, Manila (PH)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/839,305

(22) Filed: Apr. 20, 2001

(51) Int. Cl.[7] ............................................. H01L 23/12
(52) U.S. Cl. ..................... 257/704; 257/710; 257/774; 257/784; 257/701; 257/728; 257/703; 257/779
(58) Field of Search ............................... 257/728, 704, 257/701, 774, 710, 784, 778

(56) References Cited

U.S. PATENT DOCUMENTS

| | | | | |
|---|---|---|---|---|
| 4,288,284 A | * | 9/1981 | Kobayashi et al. | 156/651 |
| 5,336,928 A | * | 8/1994 | Neugebauer et al. | 257/758 |
| 5,405,808 A | * | 4/1995 | Rostoker et al. | 437/209 |
| 5,578,869 A | * | 11/1996 | Hoffman et al. | 257/691 |
| 5,585,671 A | * | 12/1996 | Nagesh et al. | 257/697 |
| 5,874,321 A | * | 2/1999 | Templeton, Jr. et al. | 438/107 |
| 5,962,922 A | * | 10/1999 | Wang | 257/773 |

* cited by examiner

*Primary Examiner*—Tom Thomas
*Assistant Examiner*—Nitin Parekh
(74) *Attorney, Agent, or Firm*—Skjerven Morrill LLP; James E. Parsons; Celisa Date

(57) ABSTRACT

A vacuum sealed package for a semiconductor chip, such as a micro-electromechanical (MEM) chip, is disclosed, along with a method of making such a package. In an exemplary embodiment, the package includes a ceramic substrate and a lid that together define a cavity wherein the chip is mounted. The substrate includes a conductive (e.g., metal) interconnect pattern that extends, at least in part, vertically through the substrate. I/O terminals are provided on an external surface of the substrate. A vent hole, at least partially lined with a metal coating, extends through the substrate into the cavity. A metal plug seals the vent hole. The vent hole is sealed by placing the package in a vacuum chamber, evacuating the chamber, and heating the chamber so as to cause a metal preform on the substrate to flow into the vent hole and form the plug.

14 Claims, 4 Drawing Sheets

VACUUM SEALED PACKAGE FOR SEMICONDUCTOR CHIP

BACKGROUND

1. Field of the Invention

The present invention relates to packages for semiconductor chips or other electronic devices.

2. Description of the Related Art

Vacuum sealed packages are used for many types of semiconductor chips including, for example, microelectromechanical (MEM) chips used in fiber optic applications. A typical vacuum sealed package for a semiconductor chip includes an internal leadframe, which functions as a substrate for the package. The leadframe includes a central metal die pad and a plurality of leads that radiate outward from the die pad. The semiconductor chip is mounted on the die pad and is electrically connected to the leads. In particular, the chip includes a plurality of bond pads, each of which is electrically connected by a bond wire or the like to a bond finger that is at an inner end of one of the leads. An outer portion of each lead extends outward from the chip, and serves as an input/output (I/O) terminal for the package. The outer portion of the leads may be bent into various configurations, such as a J lead configuration or a gull wing configuration.

In order to maintain vacuum, a metal enclosure is used. The chip and die pad are contained within the metal enclosure, with each of the leads projecting outward through a respective aperture in a peripheral side of the metal enclosure. Each aperture is sealed around the lead extending therethrough by reflowed glass, which also serves to electrically isolate the lead from the metal enclosure. A metal tube extends into the interior of the enclosure where the chip is located. After the package is assembled, a vacuum is pulled in the interior of the metal enclosure through the tube, and then the tube is crimped or soldered to seal it and maintain the vacuum.

The above-described package has numerous drawbacks. First, it is expensive to make, in part because of the need for the sealed metal enclosure. Second, the number of leads that can be accommodated is limited. Third, the package configuration does not allow for many lead configurations that are commonly used for other types of packages, such as ball grid array (BGA), land grid array (LGA), and leadless chip carriers (LCC). Fourth, the heat dissipation capability of the package is limited. Accordingly, an improved, more versatile vacuum sealed package is needed.

SUMMARY

The present invention describes a vacuum sealed package that includes a substrate that has a conductive interconnect pattern extending through the substrate to external I/O terminals. For instance, the substrate may be a multilayer ceramic substrate. A chip is mounted on the substrate and is electrically connected to the interconnect pattern of the substrate. A lid is bonded to the substrate and defines, together with the substrate, a cavity enclosing the chip. The substrate also includes at least one hole, which is at least partially lined with a metal coating, extending through the substrate and into the cavity where the chip is enclosed. The hole is blocked with a plug, such that the cavity is held in an evacuated state.

In one embodiment of an assembly method, such a vacuum sealed package is made by providing a substrate including a conductive interconnect pattern that includes external I/O terminals. The substrate also includes at least one vent hole, which extends through the substrate. The vent hole is at least partially lined with a metal coating. The substrate also includes, adjacent to the vent hole, a metal preform, which is fused to the metal coating of the vent hole. For instance, the substrate may be a multilayer ceramic substrate. A chip is mounted onto the substrate and is electrically connected to the interconnect pattern of the substrate. A lid is bonded to the substrate such that the lid and substrate together define a cavity enclosing the chip. The vent hole, which extends through the substrate, extends into the cavity. The cavity is evacuated through the vent hole. The substrate is then heated so as to melt the metal preform, which thereupon flows into the vent hole to form a plug that is fused to the metal coating of the vent hole. The plug seals the cavity in an evacuated state.

These and other aspects and features of the present invention will be better understood in view of the following detailed description of the exemplary embodiments and the drawings thereof.

BRIEF DESCRIPTION OF THE DRAWINGS

In the drawings, like or similar features are typically labeled with the same reference numbers.

DETAILED DESCRIPTION

Figure 1A:
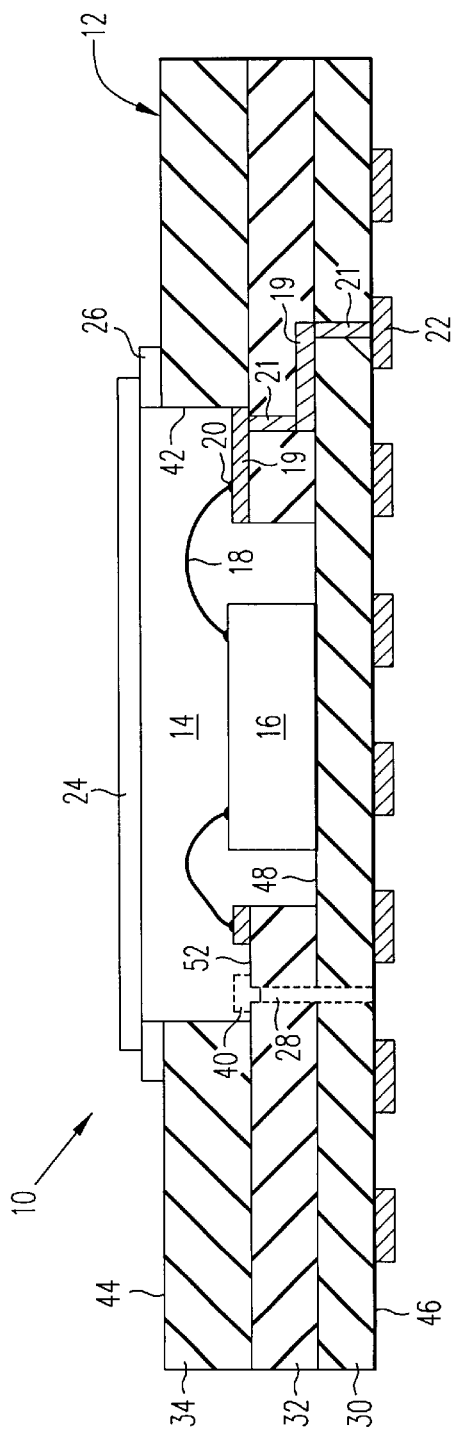
FIG. 1a is a cross-sectional side view of a vacuum sealed package having a ceramic substrate according to one embodiment of the present invention.

FIG. 1a is a cross-sectional side view of a vacuum sealed package 10 in accordance with one embodiment of the present invention. Package 10 includes a ceramic substrate 12 having a planar exterior first surface 44, an opposite planar exterior second surface 46, and a central recess 42. In this example, substrate 12 is formed by the fusing of a first ceramic layer 30, a second ceramic layer 32, and a third ceramic layer 34. Recess 42 is formed over first ceramic layer 30 by superimposed openings in second and third ceramic layers 32 and 34. Recess 42 includes an interior first surface 48 on first ceramic layer 30 and an interior second surface 52 on second ceramic layer 32.

Ceramic substrate 12 also includes a plurality of metal-filled vias 21 through first and second ceramic layers 30 and 32. Vias 21 connect respective ones of a plurality of internal horizontal conductive traces 19 formed at the interfaces between first ceramic layer 30, second ceramic layer 32, and third ceramic layer 34. A plurality of metal leadfingers 20 is provided on interior second surface 52 of second ceramic layer 32. Leadfingers 20 are exposed in recess 42 adjacent to a semiconductor chip 16, which is mounted in recess 42 on interior first surface 48 of first ceramic layer 30. Chip 16 is electrically connected to leadfingers 20 using, for example, wire bonds 18.

Wire bonds 18, leadfingers 20, conductive traces 19, and vias 21 of ceramic substrate 12 route signals between chip 16 and conductive I/O terminals 22 on planar exterior second surface 46 of ceramic substrate 12. In this example, I/O terminals 22 have the form of lands, but I/O terminals 22 may also include metal balls or bumps formed on the lands. Practitioners will appreciate that the interconnect pattern of ceramic substrate 12 can include any number of wire bonds 18, leadfingers 20, traces 19, vias 21, and I/O terminals 22 as appropriate for chip 16 and the package application. For clarity, only one complete path of the conductive interconnect pattern is shown in FIG. 1a.

A planar lid 24 is bonded to exterior first surface 44 of ceramic substrate 12 over recess 42 with a vacuum-tight seal 26. Lid 24 may be, for example, a transparent material (e.g., glass) or an opaque material (e.g., metal or ceramic). Lid 24 and recess 42 of ceramic substrate 12 define a closed cavity 14 within which chip 16 is enclosed. Conventionally, seal 26 may be formed by glass sealing, welding, soldering, or brazing, or by using a metal gasket. In one embodiment, lid 24 is seam welded to ceramic substrate 12 to minimize heating of the package and avoid inadvertent sealing of a vent hole 28.

Vent hole 28 extends from exterior second surface 46 through ceramic substrate 12 into cavity 14. Vent hole 28 is shown by dashed lines in FIG. 1a because it would not normally be visible in this cross section. Vent hole 28 is used to pull a vacuum in cavity 14 as is described below. Vent hole 28 is sealed with a metal plug 40 to maintain cavity 14 in an evacuated state.

Figure 1B:
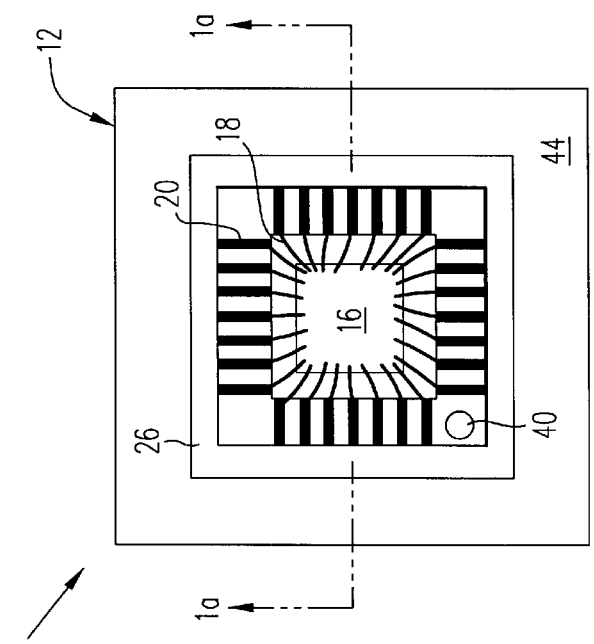
FIG. 1b is a top plan view of the package of FIG. 1a with the package lid removed.

FIG. 1b is a top plan view of package 10 of FIG. 1a looking into recess 42 of ceramic substrate 12 with lid 24 removed for clarity of view. The line of the cross section in FIG. 1a is denoted by the broken line labeled 1a in FIG. 1b. As shown, semiconductor chip 16 is electrically connected to leadfingers 20 using wire bonds 18. Twenty-eight leadfingers 20 surround chip 16, with seven leadfingers 20 adjacent to each of the four sides of chip 16. Of course, the number and arrangement of leadfingers 20 can vary.

To make package 10, ceramic substrate 12 is provided. As mentioned above, ceramic substrate 12 includes an interconnect pattern for electrically connecting chip 16, to be mounted on substrate 12, to an external structure, such as a motherboard. Substrate 12 also includes vent hole 28 that extends from exterior second surface 46 into recess 42.

Subsequently, chip 16 is placed within recess 42 and is attached to planar interior first surface 48 using an adhesive. Next, chip 16 is electrically connected to leadfingers 20 by bond wires 18 using a conventional wire bonding machine. Lid 24 is provided over recess 42 and is sealed (e.g., by seam welding) to exterior first surface 44 of substrate 12 fully around recess 42, thereby forming cavity 14 within which chip 16 is located.

After lid 24 is tightly sealed to ceramic substrate 12, cavity 14 is evacuated in a heat capable vacuum chamber, as is discussed further below. To effect the evacuation, air in cavity 14 is withdrawn through vent hole 28. Vent hole 28 is then sealed to maintain cavity 14 in an evacuated state.

Figure 2B:
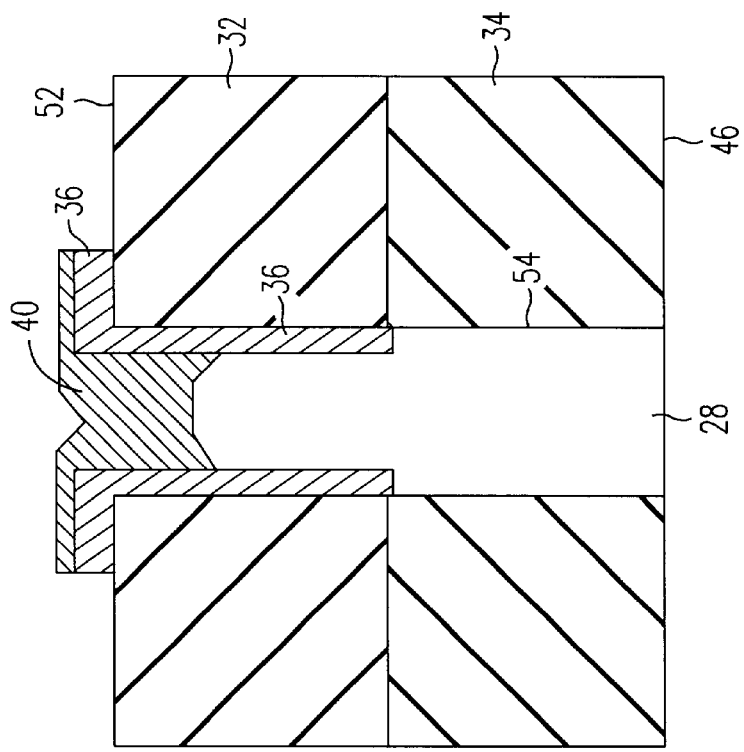
FIG. 2b is a cross-sectional side view of the vent hole of FIG. 2a after sealing.
Figure 2A:
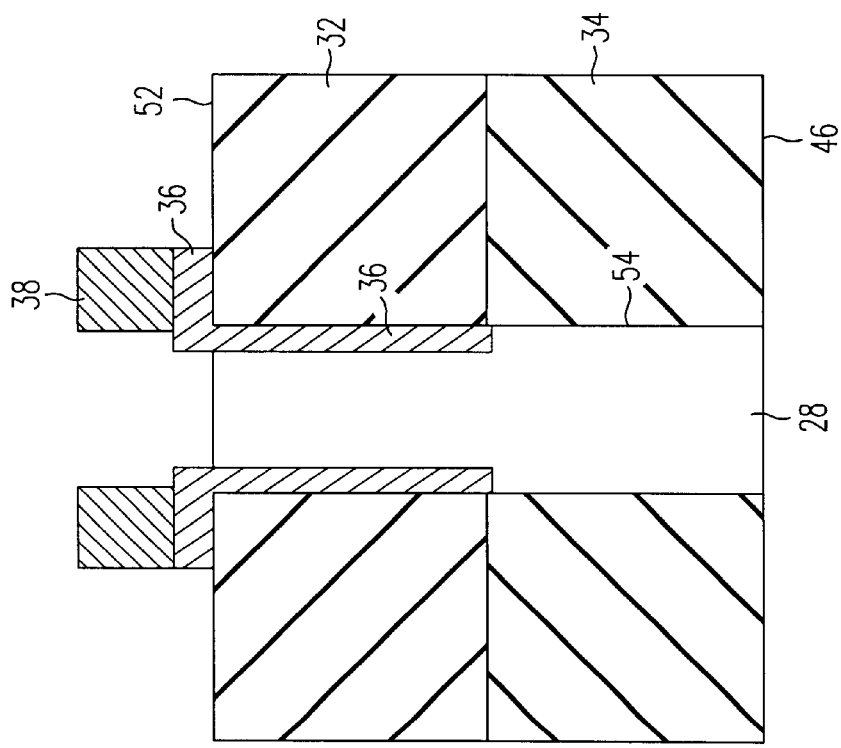
FIG. 2a is a cross-sectional side view of a vent hole through a ceramic substrate of the package of FIG. 1a before sealing.

FIG. 2a is a cross-sectional side view of the portion of substrate 12 of package 10 through which vent hole 28 is formed. In particular, this view shows substrate 12 after chip 16 is mounted in recess 42 and after lid 24 is sealed to substrate 12, but before cavity 14 is evacuated. Interior second surface 52 is within cavity 14, as mentioned above.

As mentioned, substrate 12 may include a plurality of layers, including central second ceramic layer 32 upon which leadfingers 20 are formed and lower first ceramic layer 30 upon which I/O terminals 22 are formed. Vent hole 28 is formed by superimposed openings through first ceramic layer 30 and second ceramic layer 32. A metal coating 36 extends from interior second surface 52 into vent hole 28 along an inner wall 54 of vent hole 28. Metal coating 36 lines only a sub-portion of vent hole 28, in particular, the portion of vent hole 28 formed through second ceramic layer 32. The sub-portion of vent hole 28 formed through first ceramic layer 30 is not lined with metal. In other words, only the upper half of vent hole 28 is lined with metal. Metal coating 36 is formed during the metal screening process concurrently with traces 19 and is plated concurrently with leadfingers 20, as is discussed further below.

A ring-shaped metal preform 38 with a hole therethrough is fused (e.g., by spot welding) to metal coating 36 on interior second surface 52. Metal preform 38 surrounds vent hole 28 but leaves vent hole 28 open and unblocked. Other metal preform shapes could be used, provided the preform is proximate to vent hole 28 and fused to metal coating 36. The material of metal preform 38 (e.g., gold tin solder) is chosen to have a lower melting point than the other metal structures of substrate 12 and package 10, such as metal coating 36, wire bonds 18, leadfingers 20, traces 19, vias 21, and so forth.

In this example, vent hole 28 is shown extending through first ceramic layer 30 and second ceramic layer 32 from interior second surface 52 to exterior second surface 46. Practitioners will appreciate that the location of vent hole can vary provided vent hole 28 extends into cavity 14 from an exterior surface of package 10. For example, vent hole 28 could extend only through first ceramic layer 30 from interior first surface 48 in cavity 14 to exterior second surface 46.

To evacuate cavity 14 of package 10, the entire package, with vent hole 28 open, is placed in a larger, heat capable vacuum chamber, typically with numerous other similar packages 10 undergoing a parallel process. The large vacuum chamber is evacuated, thereby evacuating cavity 14 of package 10. Cavity 14 of package 10 of FIG. 1a may be evacuated to a pressure of, for example, approximately $10^{-7}$ to $10^{-8}$ mm Hg. Once the desired vacuum level is reached, the vacuum chamber is heated, thereby heating package 10 and, in particular, metal preform 38. The temperature in the vacuum chamber is raised to a point above the melting point of metal preform 38. Accordingly, metal preform 38 melts and flows along metal coating 36. As shown in FIG. 2b, the melted metal of metal preform 38 flows into vent hole 28, forming a plug 40. The flow of melted metal preform 38 is limited to the portion of vent hole 28 lined by metal coating 36. The volume of metal preform 38 is calculated to be sufficient to close vent hole 28 upon melting. Plug 40 seals cavity 14 while maintaining the vacuum in cavity 14 when package 10 is removed from the vacuum chamber.

Ceramic substrate 12 can be made by ceramic fabrication processes that are well known in the art. In a typical process, a mixture of approximately 98% alumina and 2% refractory metals (or about 90% alumina and 10% glass) is melted at high temperature. The mixture is poured, to a controlled thickness, onto a belt to cool, resulting in a layer of "green tape" with rubber-like consistency. Three layers of green tape are used to form ceramic substrate 12, one for each of first, second, and third ceramic layers 30, 32, and 34.

Subsequently, openings of various sizes are formed in the layers of green tape, en route to forming features such as recess 42, vias 21, and vent hole 28. For instance, large rectangular openings are formed through the layers of green tape intended as second ceramic layer 32 and third ceramic layer 34 en route to forming recess 42. Small diameter holes (e.g., 200 μm diameter) are formed through the layers of green tape intended as first ceramic layer 30 and second ceramic layer 32 en route to forming vias 21. Finally, slightly larger diameter holes (e.g., 500 μm diameter) are formed through the layers of green tape intended as first ceramic layer 30 and second ceramic layer 32 en route to forming vent hole 28.

Subsequently, a metal paste, e.g. tungsten or molybdenum, is screened onto the layers of green tape to form internal horizontal conductive traces 19. The metal paste is applied under a vacuum force so that the small diameter holes are completely filled with metal paste, thereby forming portions of vias 21 for ceramic substrate 12. The metal paste is also applied on the layer of green tape intended as second ceramic layer 32 so as to coat the inner wall of the larger diameter hole that forms the portion of vent hole 28 that extends through second ceramic layer 32. Because the diameter of the holes which will ultimately form vent hole 28 is larger than the diameter of the holes used to form vias 21, vent hole 28 is coated on its inner wall 54 (forming metal coating 36 as shown in FIG. 2a), rather than being plugged by the metal paste. The larger diameter hole that forms the portion of vent hole 28 that extends through the layer of green tape intended as first ceramic layer 30 is not coated or filled by the metal paste.

Subsequently, the three layers of green tape intended as first, second, and third ceramic layers 30, 32, and 34 are stacked and then pressed together in a manner that superimposes the openings through the respective layers (forming recess 42, vias 21, and vent hole 28) and mates vias 21 to traces 19. The stack is fired at about 1800–2000° C. to sinter the stack together and drive off solvents. The layers of metal forming traces 19 are thereby fused into the surrounding ceramic layers. Nickel (e.g., 5 μm) and gold (e.g., 0.6 μm) are then plated on exposed leadfingers 20 to facilitate wire bonding to semiconductor chip 16. Metal coating 36 on a portion of inner wall 54 of vent hole 28 is also plated with nickel and gold at the same time. The nickel and gold can be plated by an electroless plating process. If an electrode plating process is used, however, metal coating 36 of vent hole 28 typically will be electrically connected to a leadfinger 20 to facilitate plating.

In the embodiment of FIGS. 2a and 2b, metal coating 36 extends only over a part of the length of vent hole 28. In particular, metal coating 36 is provided at the top portion of vent hole 28 adjacent interior first surface 48, but is not present at the lower portion of vent hole 28 adjacent exterior second surface 46. The extent to which vent hole 28 is lined by metal coating 36 may be varied. The volume of metal preform 38, however, should be adjusted to the volume of vent hole 28 that is covered by metal coating 36 to ensure complete sealing of vent hole 28.

Figure 2D:
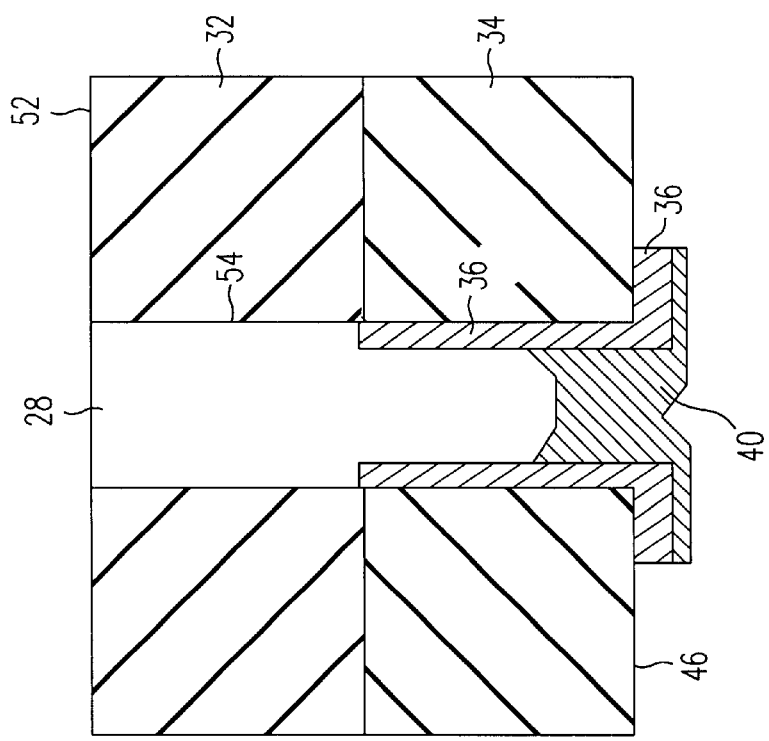
FIG. 2d is a cross-sectional side view of the vent hole of FIG. 2c after sealing.
Figure 2C:
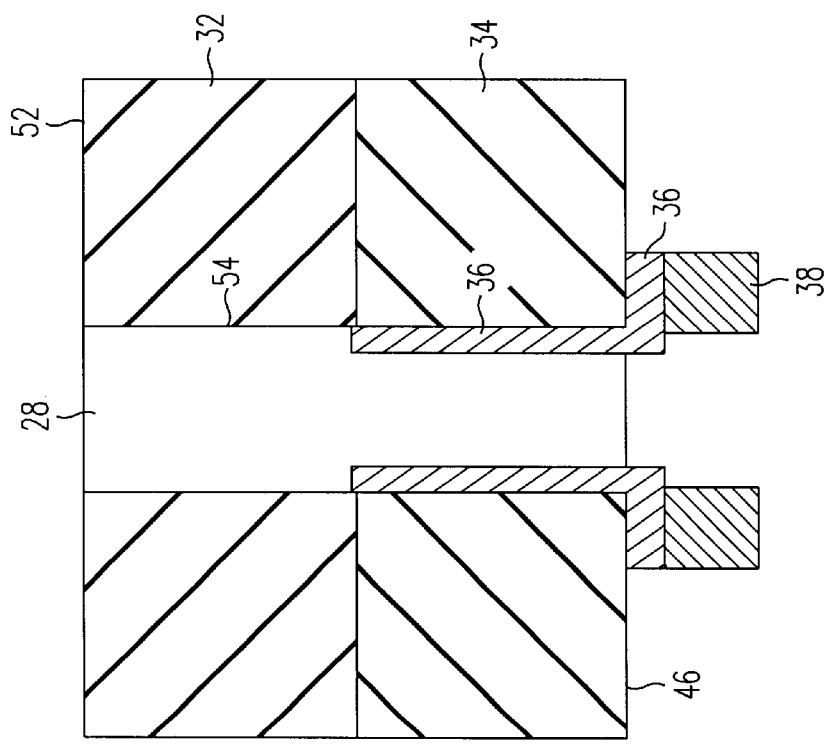
FIG. 2c is a cross-sectional side view of a vent hole through a ceramic substrate of an alternative embodiment of the package of FIG. 1a before sealing.

FIG. 2c is a cross-sectional side view of a portion of an alternative embodiment of substrate 12 of package 10. In FIG. 2c, metal coating 36 lines inner wall 54 along a bottom portion of vent hole 28 through first ceramic layer 30 adjacent exterior second surface 46, but is not present at the upper portion of vent hole 28 through second ceramic layer 32 adjacent interior second surface 52. Ring-shaped metal preform 38 with a hole therethrough is spot welded to fuse it to metal coating 36. Again, preform 38 is formed so that vent hole 28 is open and unblocked. Referring to FIG. 2d, plug 40 is formed in the same manner described above for FIG. 2b. With the embodiment of FIG. 2c, care must be taken to ensure that preform 38 does not break off of substrate 12 during handling before the evacuation step.

Figure 3:
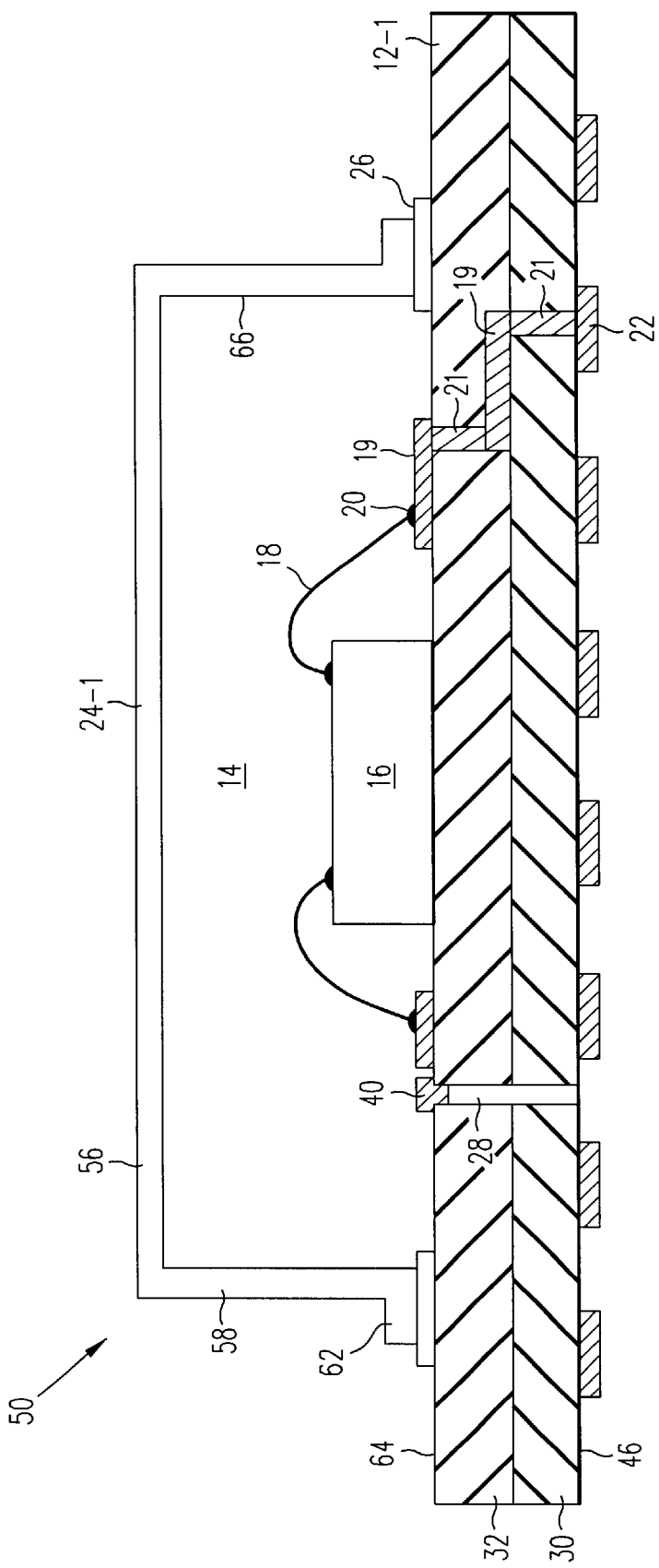
FIG. 3 is a cross-sectional side view of a vacuum sealed package having a ceramic substrate according to another embodiment of the present invention.

FIG. 3 is a cross-sectional side view of a vacuum sealed package 50 in accordance with another embodiment of the present invention. Package 50 is similar to package 10 of FIGS. 1a, 1b, 2a, and 2b and is labeled with many similar reference numbers. Accordingly, to avoid redundancy, our discussion will focus on differences between package 50 and package 10.

Package 50 includes a planar multilayer ceramic substrate 12-1, which, unlike substrate 12 of FIG. 1a, does not include central recess 42. Substrate 12-1 includes a planar first surface 64, upon which semiconductor chip 16 is mounted, opposite to planar exterior second surface 46. Substrate 12-1 has a conductive interconnect pattern like substrate 12 of FIG. 1a, including leadfingers 20 on first surface 64, vias 21, conductive traces 19, and external I/O terminals 22. Semiconductor chip 16 is electrically connected to the interconnect pattern using wire bonds 18. Substrate 12-1 also includes vent hole 28, metal coating 36, and metal plug 40 as shown in FIGS. 1a, 1b, 2a, and 2b (or 2c and 2d).

Because first surface 64 of ceramic substrate 12-1 is planar, cavity 14 is provided for package 50 using a lid 24-1. Lid 24-1, like lid 24 of FIG. 1a, may be formed of metal. Lid 24-1 includes a rectangular planar top plate 56, orthogonal sidewalls 58 perpendicular to top plate 56, and an outward extending flange 62 at a lower end of sidewalls 58 fully around lid 24-1. Lid 24-1 includes a central recess 66 defined by top plate 56 and sidewalls 58.

Flange 62 of lid 24-1 is sealed to planar first surface 64 of substrate 12-1 fully around chip 16 and leadfingers 20. Together, lid 24-1 and planar first surface 64 of substrate 12-1 define cavity 14, within which chip 16 is enclosed. Cavity 14 is evacuated and vacuum sealed using metal preform 38 that melts to form plug 40 (see FIGS. 2a and 2b or 2c and 2d) as described above.

A feature of the packages described is that land-type I/O terminals 22 are formed at a lower external second surface 46 of ceramic substrates 12 and 12-1, as in an LGA package. Practitioners will appreciate that the form of the input/output terminals on substrates 12 and 12-1 may vary. For example, conductive metal balls or bumps may be provided as I/O terminals 22 of substrates 12 and 12-1, as in a BGA package. In this respect, the packages described herein are much more versatile than the conventional metal package described in the Background section above. Further, the packages of the present invention do not have the costly metal enclosure of the conventional package described above. Also, ceramic substrates 12 and 12-1 are capable of sinking more heat generated by chip 16 than the conventional metal package.

Practitioners will see variations possible in the exemplary packages described herein. For example, flip chip mounting of chip 16 can be used in FIG. 1a or FIG. 3 to avoid the use of wire bonds 18. In addition, semiconductor chip 16 may be replaced with, for example, an organic chip.

Having completed our discussion of the exemplary embodiments, we claim our invention as follows. Our invention is not limited to the examples described herein, but rather includes all that fits within the literal and equitable scope of the appended claims.

We claim:

1. A vacuum sealed package comprising:
   a substrate having a conductive interconnect pattern that extends through the substrate and includes I/O terminals on an exterior surface thereof, said substrate including at least one hole extending through said substrate;

a chip mounted on said substrate and electrically connected to said interconnect pattern;

a lid bonded to said substrate, wherein said substrate and said lid define a cavity enclosing said chip and said hole has a first end at an interior surface of the cavity and an opposite second end at said exterior surface of the substrate;

a metal coating lining said hole, wherein said coating is formed at said first end and extends only part of a distance between said first end and said second end; and a plug fused to said coating and blocking said hole so that said cavity is held in an evacuated state.

2. The package of claim 1, wherein said substrate is formed of a ceramic material.

3. The package of claim 1, wherein said substrate includes a recess wherein said chip is mounted, and said lid is a flat plate.

4. The package of claim 1, wherein said lid includes a recess and said chip is mounted on a planar surface of said substrate to which said lid is bonded.

5. A vacuum sealed package comprising:

a ceramic substrate having a conductive interconnect pattern that extends through the substrate and includes I/O terminals on an exterior surface thereof, said substrate including at least one hole extending through said substrate;

a chip mounted on said substrate and electrically connected to said interconnect pattern;

a lid bonded to said substrate, wherein said substrate and said lid define a cavity enclosing said chip and said hole has a first end at an interior surface of the cavity and an opposite second end at said exterior surface of the substrate;

a metal coating lining said hole, wherein said coating is formed at said first end and extends only part of a distance between said first end and said second end; and a plug fused to said coating and blocking said hole so that said cavity is held in an evacuated state.

6. The package of claim 5, wherein said ceramic substrate includes a recess wherein said chip is mounted, and said lid is a flat plate.

7. The package of claim 5, wherein said lid includes a recess and said chip is mounted on a planar surface of said substrate to which said lid is bonded.

8. The package of claim 5, wherein said ceramic substrate consists of plurality of ceramic layers.

9. A vacuum sealed package comprising:

a substrate including at least one hole extending through said substrate;

a chip electrically connected to said substrate;

a lid, wherein said substrate and said lid define a cavity enclosing said chip; and a metal plug blocking said hole, wherein said hole has a first end at an interior surface of the cavity and an opposite second end at an exterior surface of the substrate, and said metal plug is blocking said at least one hole only at said first end, whereby said cavity is held in an evacuated state.

10. The package of claim 9, wherein said substrate is formed of a ceramic material.

11. A vacuum sealed package comprising:

a substrate having a conductive interconnect pattern that extends through the substrate and includes I/O terminals on an exterior surface thereof;

a chip mounted on said substrate and electrically connected to said interconnect pattern;

a lid, wherein said substrate and said lid define a cavity enclosing said chip, said substrate including at least one hole having a first end at an interior surface of the cavity and an opposite second end at said exterior surface of the substrate, said substrate including a metal coating lining said hole and formed at said first end and extending only part of a distance between said first end and said second end; and a metal plug fused to said coating and blocking said hole so that said cavity is held in an evacuated state.

12. The package of claim 11, wherein said substrate is formed of a ceramic material.

13. The package of claim 11, wherein said substrate includes a recess wherein said chip is mounted, and said lid is a flat plate.

14. The package of claim 11, wherein said lid includes a recess and said chip is mounted on a planar surface of said substrate to which said lid is bonded.

* * * * *